United States Patent
Im et al.

(10) Patent No.: US 7,915,649 B2
(45) Date of Patent: Mar. 29, 2011

(54) LIGHT EMITTING DISPLAY DEVICE AND METHOD OF FABRICATING THE SAME

(75) Inventors: Ki-Ju Im, Suwon-si (KR); Byoung-Deog Choi, Suwon-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 319 days.

(21) Appl. No.: 12/219,262

(22) Filed: Jul. 18, 2008

(65) Prior Publication Data

US 2009/0072248 A1   Mar. 19, 2009

(30) Foreign Application Priority Data

Sep. 14, 2007   (KR) .................. 10-2007-0093632

(51) Int. Cl.
*H01L 27/148*   (2006.01)
(52) U.S. Cl. ............... 257/233; 257/292; 257/E25.032; 257/E51.005; 438/149
(58) Field of Classification Search .............. 438/149; 257/233, 292, E25.032, E51.005
See application file for complete search history.

(56) References Cited

U.S. PATENT DOCUMENTS

| | | | |
|---|---|---|---|
| 2006/0030084 A1 * | 2/2006 | Young | 438/149 |
| 2006/0145207 A1 | 7/2006 | Kim et al. | |
| 2007/0093007 A1 | 4/2007 | Deane | |

FOREIGN PATENT DOCUMENTS

| | | |
|---|---|---|
| KR | 10-2003-0058720 A | 7/2003 |
| KR | 10-2004-0056461 A | 7/2004 |
| KR | 1020040056461 A * | 7/2004 |
| KR | 10-2006-0077122 A | 7/2006 |
| KR | 10-2006-0077175 A | 7/2006 |

* cited by examiner

Primary Examiner — Evan Pert
Assistant Examiner — Scott Wilson
(74) Attorney, Agent, or Firm — Lee & Morse, P.C.

(57) ABSTRACT

A light emitting display device includes a light emitting diode and a thin film transistor on a substrate, the light emitting diode and thin film transistor being electrically coupled to each other, and a photo diode on the substrate, the photo diode including an N-type doping region, a P-type doping region, and an intrinsic region between the N-type doping region and the P-type doping region, the intrinsic region including amorphous silicon.

20 Claims, 3 Drawing Sheets

LIGHT EMITTING DISPLAY DEVICE AND METHOD OF FABRICATING THE SAME

BACKGROUND OF THE INVENTION

1. Field of the Invention

Embodiments of the present invention relate to a light emitting display device and a method of fabricating the same. More particularly, embodiments of the present invention relate to a light emitting display device with a photo diode and to a method of fabricating the same.

2. Description of the Related Art

A light emitting display device may include a light emitting diode (LED) that emits visible light to display images. The LED, however, may have high power consumption due to a constant luminance value thereof regardless of changes in ambient light. Therefore, attempts have been made to use a photo diode (PD) to control luminance of the LED. The PD may convert light energy, e.g., light emitted from the LED or ambient light, into an electrical signal, e.g., electric current or voltage, by generating electrons or holes in accordance with an optical absorption, e.g., intensity of light.

The conventional PD in the light emitting display device, however, may be formed of polycrystalline silicon. The polycrystalline silicon may have a relatively low light sensitivity, so light receiving efficiency of the conventional PD may be relatively low. The low light receiving efficiency of the PD may generate an insufficient amount of electrical signals, so luminance control of the LED may be difficult.

SUMMARY OF THE INVENTION

Embodiments of the present invention are therefore directed to a light emitting display device and a method of fabricating the same, which substantially overcome one or more of the disadvantages and shortcomings of the related art.

It is therefore a feature of an embodiment of the present invention to provide a light emitting display device with a PD having improved light receiving efficiency.

It is therefore another feature of an embodiment of the present invention to provide a method of fabricating a light emitting display device with a PD having improved light receiving efficiency.

At least one of the above and other features and advantages of the present invention may be realized by providing a light emitting display device, including a light emitting diode and a thin film transistor on a substrate, the light emitting diode and thin film transistor being electrically coupled to each other, and a photo diode on the substrate, the photo diode including an N-type doping region, a P-type doping region, and an intrinsic region between the N-type doping region and the P-type doping region, the intrinsic region including amorphous silicon. The intrinsic region of the photo diode may include one or more of argon (Ar), hydrogen ($H_2$), nitrogen ($N_2$), and/or silane ($SiH_4$).

The light emitting display device may further include a controller, the controller being configured to control voltage applied to the light emitting diode in accordance with an electrical signal output from the photo diode. The photo diode may be spaced apart from the thin film transistor. The photo diode and the thin film transistor may be co-planar along a plane parallel to a plane of the substrate. The photo diode may have a horizontal structure.

At least one of the above and other features and advantages of the present invention may be also realized by providing a method for fabricating a light emitting display device, including forming a thin film transistor on a substrate, forming a photo diode on the substrate, the photo diode including an N-type doping region, a P-type doping region, and an intrinsic region between the N-type doping region and the P-type doping region, the intrinsic region including amorphous silicon, and forming a light emitting diode on the substrate, such that the light emitting diode and the thin film transistor are electrically coupled to each other.

Forming the thin film transistor and the photo diode on the substrate may include disposing a first polycrystalline silicon layer and a second polycrystalline silicon layer, respectively, on the substrate. The first and second polycrystalline silicon layers may be co-planar. Forming the thin film transistor on the substrate may include doping one side of the first polycrystalline silicon layer with N-type impurities and doping an opposing side of the first polycrystalline layer with P-type impurities to form source and drain regions, such that a channel region may be formed between the source and drain regions. Forming the photo diode on the substrate may include doping one side of the second polycrystalline silicon layer with N-type impurities and doping an opposing side of the second polycrystalline layer with P-type impurities, such that an intrinsic region may be formed between the N-type and P-type implanted impurities. The method may further include doping the intrinsic region with an impurity element, such that at least a portion of the polycrystalline silicon in the intrinsic region may be converted into amorphous silicon. Doping the intrinsic region may include converting substantially all the polycrystalline silicon in the intrinsic region into amorphous silicon, such that the intrinsic region is substantially amorphous. The impurity elements may be one or more of argon (Ar), hydrogen ($H_2$), nitrogen ($N_2$), and/or silane ($SiH_4$). Doping the intrinsic region with an impurity element may include forming a photosensitive film on the photodiode, and etching the photosensitive film to expose the intrinsic region.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
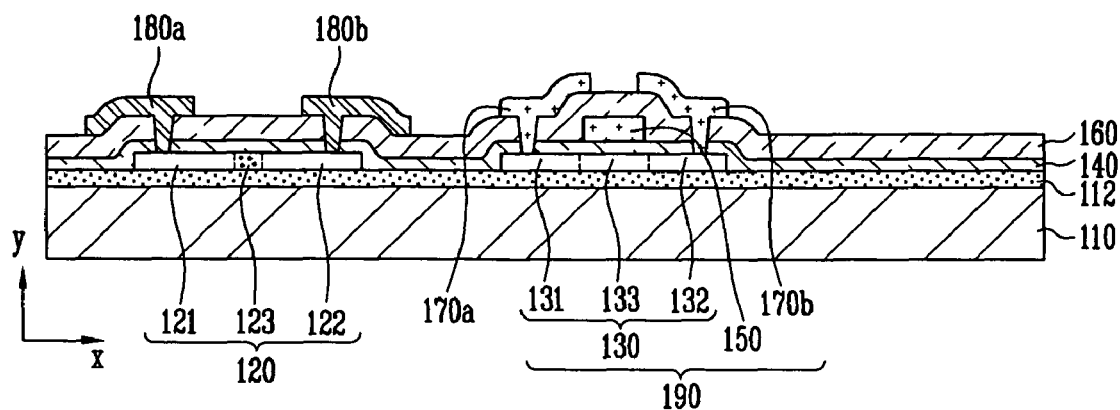
FIG. 1 illustrates a partial cross-sectional view of a light emitting display device according to an exemplary embodiment of the present invention.

Korean Patent Application No. 10-2007-0093632, filed on Sep. 14, 2007, in the Korean Intellectual Property Office, and entitled: "Light Emitting Display Device and Method of Fabricating the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will be understood that the term "on" can indicate solely a vertical arrangement of one element with respect to another element, and may not indicate a vertical orientation, e.g., a horizontal orientation. In addition, it will be understood that when a layer or element is referred to as being "under" another layer or element, it can be directly under, or one or more intervening layers and/or elements may also be present. Further, it will also be understood that when a layer or element is referred to as being "between" two layers or elements, it can be the only layer or element between the two layers or elements, or one or more intervening layers and/or elements may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not FIG. 1 illustrates a cross-sectional view of a light emitting display device according to one exemplary embodiment of the present invention. Referring to FIG. 1, a light emitting display device 100 may include a TFT 190 and a PD 120 on a substrate 110. The light emitting display device 100 may further include a LED (not shown), e.g., an organic light emitting diode (OLED), on the substrate 110.

More specifically, a buffer layer 112 may be disposed between the substrate 110 and the TFT 190, so the TFT 190 may be formed on the buffer layer 112. The TFT 190 may include a semiconductor layer 130, a gate electrode 150, and source/drain electrodes 170a and 170b. The semiconductor layer 130 of the TFT 190 may be disposed on the buffer layer 112, and may include a source region 131, a drain region 132, and a channel region 133 between the source region 131 and the drain region 132.

A first dielectric layer 140 may be formed on the buffer layer 112 to cover the semiconductor layer 130, i.e., the semiconductor layer 130 may be between the buffer layer 112 and the first dielectric layer 140. The gate electrode 150 may be formed on the first dielectric layer 140 in a region corresponding to the channel region 133 of the semiconductor layer 130. A second dielectric layer 160 may be formed on the first dielectric layer 140 to cover the gate electrode 150, i.e., the gate electrode 150 may be between the first and second dielectric layers 140 and 160. The source and drain electrodes 170a and 170b may be disposed on the second dielectric layer 160, so the source electrode 170a and the drain electrode 170b may be coupled respectively to the source region 131 and the drain region 132 of the semiconductor layer 130 through contact holes in the first and second dielectric layers 140 and 160.

The light emitting display device 100 may further include a third dielectric layer (not shown) on the TFT 190, so the LED may be formed on the third dielectric layer. The LED may be electrically coupled to the TFT 190. The LED may be any suitable LED, e.g., an OLED. A controller may be connected to the LED for controlling luminance thereof in accordance with electrical signals, e.g., voltage signals, output by the PD 120.

The PD 120 of the light emitting display device 100 may be electrically coupled to the LED, and may control luminance of the LED. For example, the PD 120 may be between the substrate 110 and the LED in a non-light emission region of the light emitting display device 100. In particular, the PD 120 may be on the buffer layer 112, and may be spaced apart from the TFT 190 along the x-axis. More specifically, the semiconductor layer 130 of the TFT 190 and the PD 120 may be co-planar along a plane parallel to the substrate 110, e.g., a horizontal plane along the x-axis. For example, both the semiconductor layer 130 and the PD 120 may be directly on the buffer layer 112.

The photodiode 120 may include an N-type doping region 121, a P-type doping region 122, an intrinsic region 123 between the N-type doping region 121 and the P-type doping region 122. The N-type doping region 121 and the P-type doping region 122 may include polycrystalline silicon, and the intrinsic region 123 of the PD 120 may include amorphous silicon. Use of amorphous silicon in the intrinsic region 121 may enhance light receiving efficiency of the PD 120. In particular, as will be discussed in more detail below with reference to FIG. 3, amorphous silicon has an excellent light receiving efficiency due to its higher sensitivity to light, so the PD 120 may have improved light receiving efficiency as compared, e.g., to a photo diode including an intrinsic region without amorphous silicon.

The N-type doping region 121, P-type doping region 122, and intrinsic region 123 may be coplanar along a plane parallel to the substrate 110. For example, each of the N-type doping region 121, P-type doping region 122, and intrinsic region 123 may be formed directly on the buffer layer 112. A thickness of the light emitting display device 100 may be minimized due to a horizontal structure of the PD 120, i.e., the N-type doping region 121, P-type doping region 122, and intrinsic region 123 being on a substantially same plane.

The first and second dielectric layers 140 and 160 may be on the PD 120, so N-type and P-type electrodes 180a and 180b may be electrically coupled to the N-type doping region 121 and P-type doping region 122, respectively, via contact holes in the first and second dielectric layers 140 and 160. The N-type and P-type electrodes 180a and 180b may be used for applying a voltage to the N-type doping region 121 and the P-type doping region 122, respectively.

The PD 120 may be a semiconductor device for converting an optical signal into an electrical signal, and its driving method is as follows. When a positive (+) voltage is applied to the N-type doping region 121 through the N-type electrode 180b and a negative (−) voltage is applied to the P-type doping region 122 through the P-type electrode 180a, the PD 120 generates electrons and holes in the intrinsic region 123 in accordance with light incident on the intrinsic region 123. Also, the electrons and/or holes generated in the N-type doping region 121 and/or the P-type doping region 122 may be spread into the intrinsic region 123. Electric current may flow in the intrinsic region 123 by means of a reverse electric field. Since the intrinsic region 123 of the PD 120 is formed of amorphous silicon, an amount of electric current flowing through the PD 120 in accordance with the incident light may be increased. The increased electric current through the PD 120 may improve electrical signals generated and transmitted to control luminance of the LED with respect to light incident on the intrinsic region 123, e.g., ambient light.

FIGS. 2A-2E illustrate sequential cross-sectional views of a method for fabricating the light emitting display device 100 according to one exemplary embodiment of the present invention.

Figure 2A:
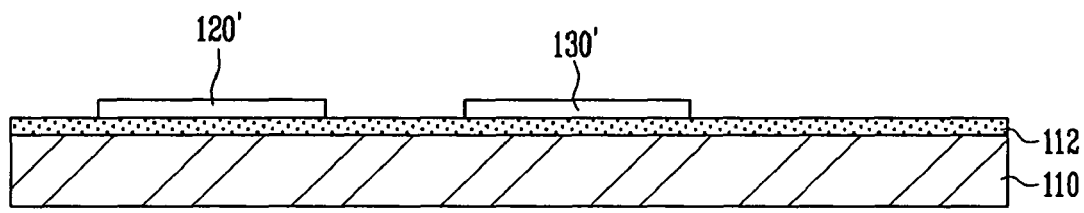
FIGS. 2A-2E illustrate a partial cross-sectional view of a light emitting display device according to an exemplary embodiment of the present invention.

Referring to FIG. 2A, the buffer layer 112 may be formed on the substrate 110. Patterned first and second polycrystalline silicon layers 120' and 130' may be formed on an upper surface of the buffer layer 112. The first and second polycrystalline silicon layers 120' and 130' may be spaced apart from each other.

Figure 2B:
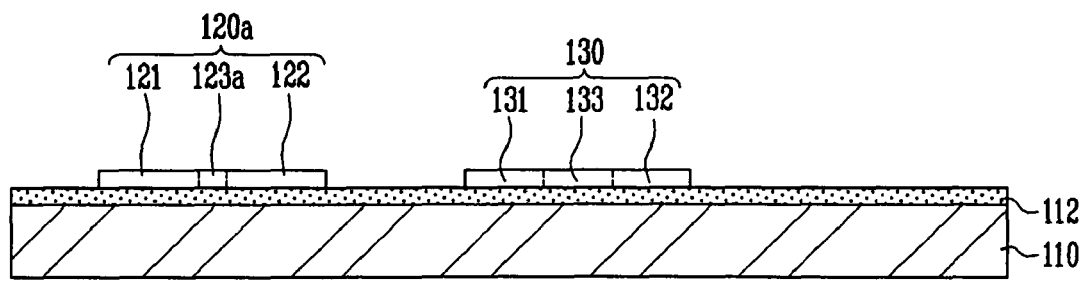

Referring to FIG. 2B, an ion implantation process may be performed on each side of the first and second polycrystalline silicon layers 120' and 130'. More specifically, N-type and P-type impurities may be implanted in opposite sides of the first polycrystalline silicon layer 120' to form the N-type doping region 121 and the P-type doping region 122, respectively. A portion of the first polycrystalline silicon layer 120' not treated for implantation of the N-type and/or P-type impurities, i.e., a portion between the N-type doping region 121 and the P-type doping region 122, may define an intermediate portion 123a. Similarly, N-type and P-type impurities may be implanted in opposite sides of the second polycrystalline silicon layer 130' to form the source and drain regions 131 and 132. A portion of the second polycrystalline silicon layer 130' not treated for implantation of the N-type and/or P-type impurities, i.e., a portion between the source and drain regions 131 and 132, may define the channel region 133.

The source and drain regions 131 and 132 with the channel region 133 therebetween may define the semiconductor layer 130 of the TFT 190. The N-type doping region 121 and the P-type doping region 122 with the intermediate portion 123a therebetween may define an intermediate element 120a to subsequently become the PD 120. Fabrication process of the light emitting display device 100 may be simplified by using polycrystalline silicon to form portions of both the PD 120 and the semiconductor layer 130 on a substantially same plane.

Figure 2C:
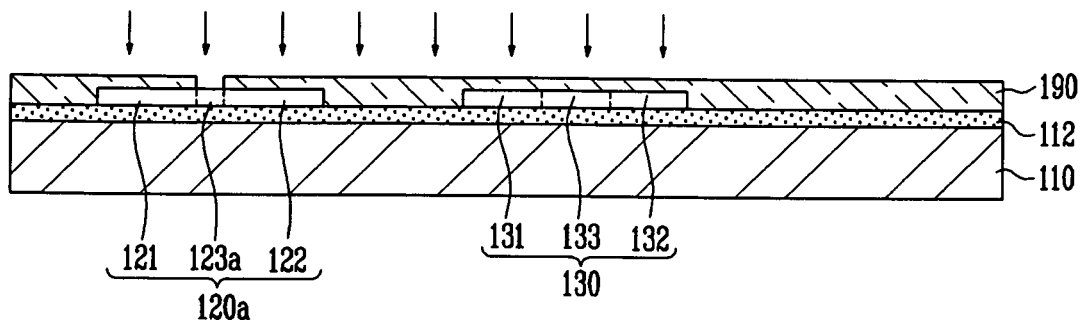

Referring to FIG. 2C, a photosensitive film 190 may be formed on the buffer layer 112 to cover the intermediate element 120a and the semiconductor layer 130. A mask (not shown) may be used to etch the photosensitive film 190 to have a predetermined pattern, i.e., a pattern exposing an upper surface of the intermediate portion 123a to ambient, i.e., external, environment. Then, the intermediate portion 123a may be doped with impurities through the photosensitive film 190 to convert the polycrystalline silicon in the intermediate portion 123a into amorphous silicon. For example, one or more of argon (Ar), hydrogen ($H_2$), nitrogen ($N_2$), and/or silane ($SiH_4$) may be implanted into the intermediate portion 123a. During implantation, portions of the polycrystalline silicon lattice in the intermediate portion 123a may be damaged, so regions including the damaged lattice may be converted into amorphous silicon. Therefore, the intermediate portion 123a made of polycrystalline silicon may be converted into the intrinsic region 123 to include amorphous silicon having high sensitivity to the light.

Since the intrinsic region 123 is a portion of the PD 120 that receives light, an increased sensitivity to light of the intrinsic region 123 may increase the light receiving efficiency of the PD 120. More specifically, treatment via the ion implantation process of a polycrystalline silicon intermediate portion 123a to form an amorphous silicon intrinsic region 123 may increase a light sensitivity ratio, i.e., a dynamic difference between ON/OFF current states through the PD, so overall sensitivity of the PD 120 to light may be increased. Therefore, the PD 120 may detect intensity of ambient light of the light emitting display device 100 more accurately, and may provide improved luminance control of the LED according to the ambient light.

Figure 2D:
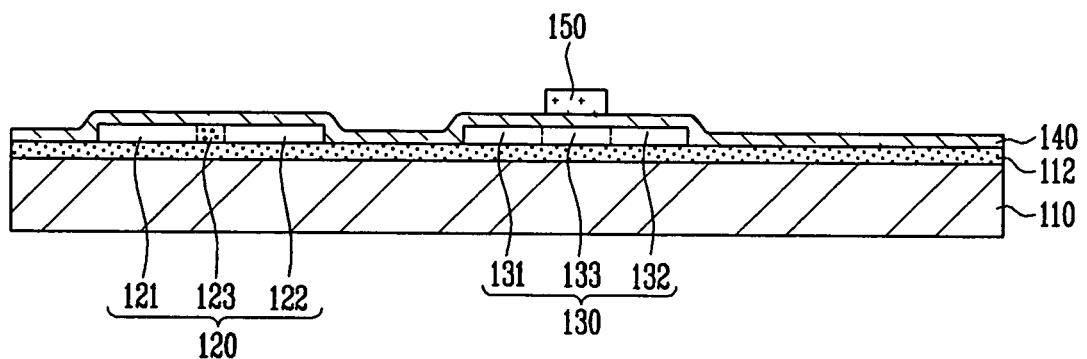

Referring to FIG. 2D, the first dielectric layer 140 may be formed on the buffer layer 112 to cover the semiconductor layer 130 and the PD 120. Also, the gate electrode 150 may be formed on the first dielectric layer 140 in a region corresponding to the channel region 133 of the semiconductor layer 130, i.e., the gate electrode 150 may overlap the channel region 133.

Figure 2E:
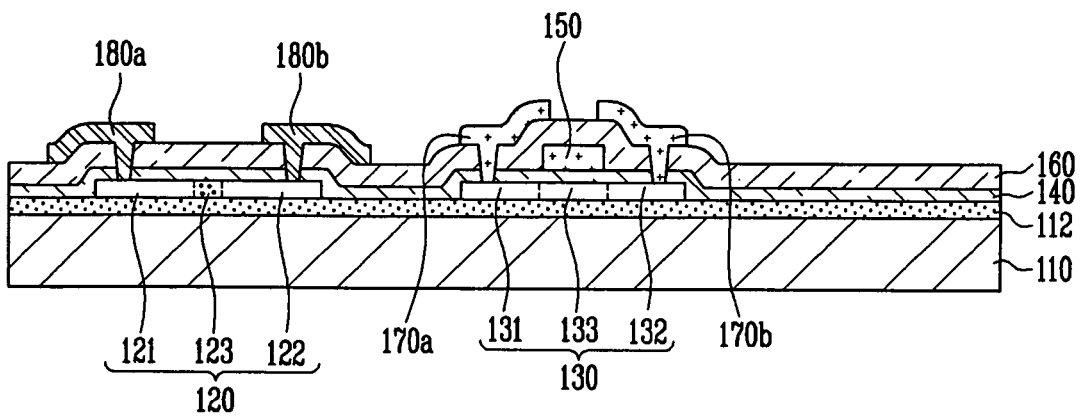

Referring to FIG. 2E, the second dielectric layer 160 may be formed on the first dielectric layer 140 to cover the gate electrode 150. Then, the first and second dielectric layers 140 and 160 may be etched to form contact holes therethrough to expose portions of upper surfaces of the source/drain regions 131 and 132 of the semiconductor layer 130 and portions of upper surfaces of the N-type doping region 121 and the P-type doping region 122 of the PD 120. Source and drain electrodes 170a and 170b may be coupled via the contact holes to the source and drain regions 132 and 133, respectively. The N-type and P-type electrodes 180a and 180b may be coupled via the contact holes to the N-type doping region 121 and the P-type doping region 122 of the PD 120, respectively.

Figure 3:
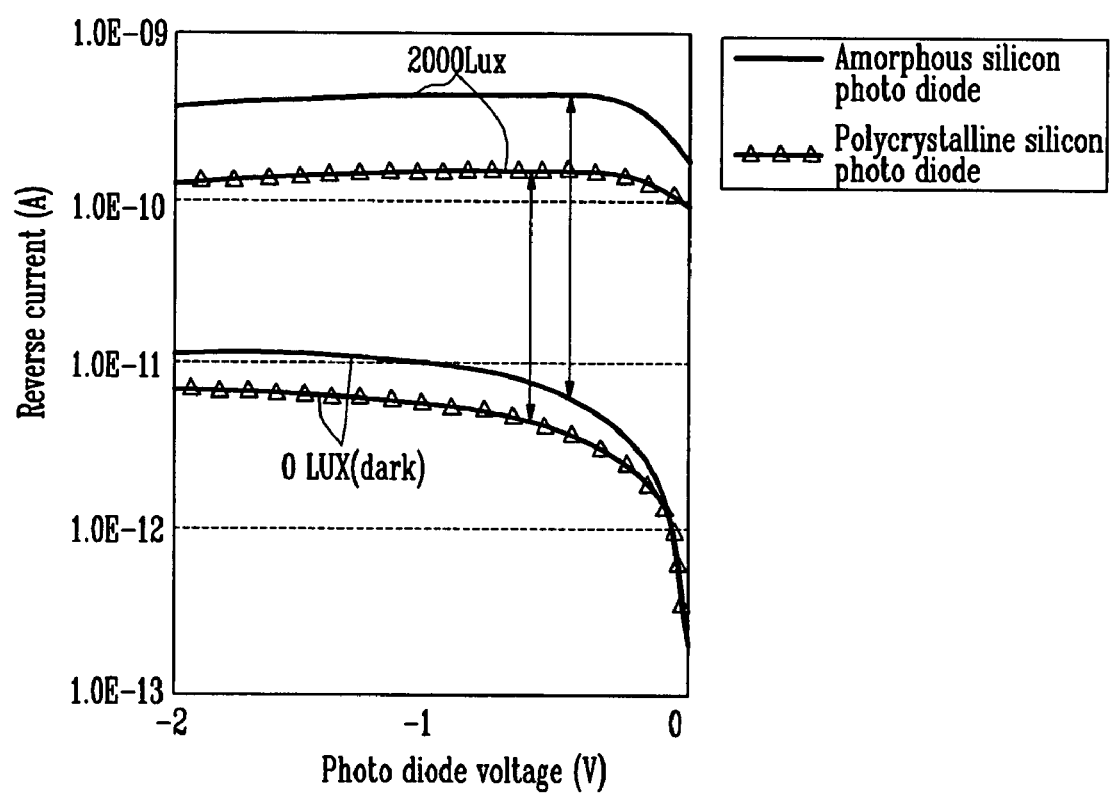
FIG. 3 illustrates a graph comparing light sensitivity of a conventional PD and a PD according to an exemplary embodiment of the present invention.

FIG. 3 illustrates a graph comparing light sensitivity of an amorphous silicon PD and a polycrystalline silicon PD. In FIG. 3, the x-axis represents voltage (V) applied to the PD, and the y-axis represents a reverse current (A) of the PD that is varied according to the voltage applied to the PD. Generally, an external light of the PD is measured when a voltage of $-0.5$ to $-2.0$ (V) is applied to the PD.

A voltage of $-2$ to $0$ (V) was applied to each PD, and a reverse current of the PD was measured when the voltage on the PD was varied between $-2$ V to $0$ V. Next, ambient light was measured by each PD. In order to determine sensitivity of each of the PDs to light, a sensitivity ratio was measured. The sensitivity ratio refers to a dynamic difference between ON/OFF states of the reverse current. In other words, the sensitivity ratio refers to a difference between an OFF state, i.e., a reverse current through the PD when external luminance is 0 Lux, and an ON state, i.e., a reverse current through the PD when the external luminance is greater than 0 Lux at a substantially same voltage. An external luminance of 0 Lux refers to dark surroundings with substantially no light, and an external luminance that is greater than 0 Lux was used as 2000 Lux. The PD was determined as having an increased sensitivity to light if a sensitivity ratio thereof was high. For example, a higher sensitivity ratio between the ON/OFF states of the reverse current indicated a higher sensitivity to light.

As illustrated in FIG. 3, the amorphous silicon PD exhibited a higher sensitivity ratio than the polycrystalline silicon PD, i.e., a higher reverse current ratio between the two curves indicated by the double-headed arrows in FIG. 3. More specifically, as illustrated in FIG. 3, a sensitivity ratio of the polycrystalline silicon PD at a voltage varying from about $(-0.5)$ V to about $(-2.0)$ V was about 1-1.5 orders (v/decade), while a sensitivity ratio of the amorphous silicon PD at a same voltage range was about 1.2-1.8 orders. As such, the amorphous silicon PD may have a higher sensitivity ratio, e.g., by about 0.3 to about 0.5 orders. Here, 1 order represents $10^{-1}$ (A), and 2 orders represent $10^{-2}$ (A). Also, the amorphous silicon PD exhibited better accuracy in measuring ambient light due to its increased sensitivity to the light. Further, the amorphous silicon PD may have a current value as much as 3 times higher than the polycrystalline silicon PD, thereby indicating that an area of the amorphous silicon PD is increased as compared to the polycrystalline silicon PD.

As described above, the amorphous silicon PD may have a larger area for detecting light, and may exhibit a higher sensitivity than the polycrystalline silicon PD. Therefore, the amorphous silicon PD may measure ambient light more accurately.

As described above, according to embodiments of the present invention, the light receiving efficiency of the PD may be enhanced by forming a light receiver of the PD, i.e., the intrinsic region, into amorphous silicon. Therefore, the PD may be used to detect ambient light of the light emitting display device more effectively. As a result, it is possible to control the luminance of the LED according to the intensity of the ambient light of the light emitting display device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A light emitting display device, comprising:
   a light emitting diode and a thin film transistor on a substrate, the light emitting diode and the thin film transistor being electrically coupled to each other; and
   a photo diode on the substrate, the photo diode including an N-type doping region, a P-type doping region, and an intrinsic region between the N-type doping region and the P-type doping region, the intrinsic region including amorphous silicon and the N-type doping region and the P-type doping region being composed of a polycrystalline silicon layer.

2. The light emitting display device as claimed in claim 1, wherein the intrinsic region of the photo diode includes one or more of argon (Ar), hydrogen (H$_2$), nitrogen (N$_2$), and/or silane (SiH$_4$).

3. The light emitting display device as claimed in claim 1, wherein the photo diode is spaced apart from the thin film transistor.

4. The light emitting display device as claimed in claim 3, wherein the photo diode and the thin film transistor are co-planar along a plane parallel to a plane of the substrate.

5. The light emitting display device as claimed in claim 4, wherein the photo diode has a horizontal structure.

6. The light emitting display device as claimed in claim 1, wherein:
   the thin film transistor includes a semiconductor layer having a source region, a drain region, and a channel region between the source and drain regions; and
   the source region, the drain region, the channel region, the N-type doping region, the P-type doping region, and the intrinsic region are co-planar along the plane parallel to the plane of the substrate.

7. The light emitting display device as claimed in claim 6, wherein one of the source region or the drain region includes N-type impurities and another of the source region or the drain region includes P-type impurities.

8. The light emitting display device as claimed in claim 1, wherein a first dielectric layer overlaps lateral ends of the source region, the drain region, the N-typed doping region, and the P-type doping region.

9. A method for fabricating a light emitting display device, comprising:
   forming a thin film transistor on a substrate,
   forming a photo diode on the substrate, the photo diode including an N-type doping region, a P-type doping region, and an intrinsic region between the N-type doping region and the P-type doping region, the intrinsic region including amorphous silicon and the N-type doping region and the P-type doping region being composed of a polycrystalline silicon layer; and
   forming a light emitting diode on the substrate, such that the light emitting diode and the thin film transistor are electrically coupled to each other.

10. The method as claimed in claim 9, wherein:
    the polycrystalline silicon layer is a first polycrystalline silicon layer; and
    forming the photo diode and the thin film transistor on the substrate includes disposing the first polycrystalline silicon layer and a second polycrystalline silicon layer, respectively, on the substrate.

11. The method as claimed in claim 10, wherein the first and second polycrystalline silicon layers are co-planar.

12. The method as claimed in claim 10, wherein forming the photo diode on the substrate includes doping one side of the first polycrystalline silicon layer with N-type impurities and doping an opposing side of the first polycrystalline layer with P-type impurities such that an intrinsic region is formed between the N-type and P-type implanted impurities.

13. The method as claimed in claim 12, wherein forming the thin film transistor on the substrate includes doping one side of the second polycrystalline silicon layer with N-type impurities and doping an opposing side of the second polycrystalline layer with P-type impurities to form source and drain regions, such that a channel region is formed between the source and drain regions.

14. The method as claimed in claim 13, further comprising doping the intrinsic region with an impurity element, such that at least a portion of the polycrystalline silicon in the intrinsic region is converted into amorphous silicon.

15. The method as claimed in claim 14, wherein doping the intrinsic region includes converting substantially all the polycrystalline silicon in the intrinsic region into amorphous silicon, such that the intrinsic region is substantially amorphous.

16. The method as claimed in claim 14, wherein the impurity elements is one or more of argon (Ar), hydrogen (H$_2$), nitrogen (N$_2$), and/or silane (SiH$_4$).

17. The method as claimed in claim 14, wherein doping the intrinsic region with an impurity element includes,
    forming a photosensitive film on the photodiode; and
    etching the photosensitive film to expose the intrinsic region.

18. The method as claimed in claim 9, wherein:
    forming the thin film transistor includes forming a semiconductor layer having a source region, a drain region, and a channel region between the source and drain regions; and
    the source region, the drain region, the channel region, the N-type doping region, the P-type doping region, and the intrinsic region are formed co-planar along the plane parallel to the plane of the substrate.

19. The light emitting display device as claimed in claim 18, wherein one of the source region or the drain region includes N-type impurities and another of the source region or the drain region includes P-type impurities.

20. A method for fabricating a light emitting display device, comprising:
    forming a thin film transistor on a substrate,
    forming a photo diode on the substrate, the photo diode including an N-type doping region, a P-type doping region, and an intrinsic region between the N-type doping region and the P-type doping region, the intrinsic region including amorphous silicon; and forming a light emitting diode on the substrate, such that the light emitting diode and the thin film transistor are electrically coupled to each other, wherein:

forming the photo diode and the thin film transistor on the substrate includes disposing a first polycrystalline silicon layer and a second polycrystalline silicon layer, respectively, on the substrate and includes doping one side of the first polycrystalline silicon layer with N-type impurities and doping an opposing side of the first polycrystalline layer with P-type impurities, such that an intrinsic region is formed between the N-type and P-type implanted impurities; and forming the thin film transistor on the substrate includes doping one side of the second polycrystalline silicon layer with N-type impurities and doping an opposing side of the second polycrystalline layer with P-type impurities to form source and drain regions, such that a channel region is formed between the source and drain regions.

* * * * *